United States Patent [19]

Sarubbi

[11] Patent Number: 5,132,376
[45] Date of Patent: Jul. 21, 1992

[54] PROCESS FOR SELECTIVE REMOVAL OF DIMERIC SPECIES FROM PHENOLIC POLYMERS

[75] Inventor: Thomas R. Sarubbi, Providence, R.I.

[73] Assignee: OCG Microelectronic Materials, Inc., Cheshire, Conn.

[21] Appl. No.: 630,673

[22] Filed: Dec. 20, 1990

Related U.S. Application Data

[62] Division of Ser. No. 404,829, Sep. 8, 1989, abandoned.

[51] Int. Cl.⁵ .............................................. C08L 61/06
[52] U.S. Cl. ................................. 525/480; 430/190; 430/191; 430/192; 525/504; 528/129; 528/155
[58] Field of Search ............... 525/480, 504; 430/191, 430/192, 190; 528/129, 155

[56] References Cited

U.S. PATENT DOCUMENTS

| | | |
|---|---|---|
| 4,517,276 | 5/1985 | Lewis .................................. 430/192 |
| 4,529,682 | 7/1985 | Toukhy ............................... 430/190 |
| 4,624,909 | 11/1986 | Saotome et al. .................... 430/192 |
| 4,738,915 | 4/1988 | Komine et al. ..................... 430/191 |
| 4,755,543 | 7/1988 | Bertram et al. .................... 523/222 |
| 4,812,551 | 3/1989 | Oi et al. .............................. 528/129 |
| 4,863,829 | 9/1989 | Furata et al. ....................... 430/192 |

FOREIGN PATENT DOCUMENTS

| | | |
|---|---|---|
| 144880 | 6/1985 | European Pat. Off. . |
| 60-45238 | 3/1985 | Japan . |
| 60-57339 | 4/1985 | Japan . |
| 60-189739 | 9/1985 | Japan . |
| 62-172341 | 8/1987 | Japan . |
| 63-249143 | 10/1988 | Japan . |
| 1-93734 | 4/1989 | Japan . |
| 1-94339 | 4/1989 | Japan . |

OTHER PUBLICATIONS

ACS Symposium Ser. No. 226, 1984, pp. 340–360.

*Primary Examiner*—Nathan M. Nutter
*Assistant Examiner*—Richard Lee Jones

[57] ABSTRACT

Process for producing dimer-free phenolic polymers, particularly novolak polymers produced from cresol mixtures, and photoresist compositions containing such dimer-free novolak polymers. The process comprises reacting phenolic polymers containing phenolic dimers with a capping agent, such as a silylating agent, to cap all of the phenolic hydroxy groups. This reduces the distillation temperature of the capped dimers and renders the capped polymer stable at such distillation temperature. The capped dimers are distilled off, and finally the phenolic polymer is uncapped. Dimer-free novolaks produce scum-free developed photoresist images.

9 Claims, No Drawings

PROCESS FOR SELECTIVE REMOVAL OF DIMERIC SPECIES FROM PHENOLIC POLYMERS

This application is a division of application Ser. No. 404,829, filed Sept. 8, 1989, and now abandoned.

BACKGROUND OF THE INVENTION

1. Field of the Invention

The present invention relates to a novel process for the complete and selective removal of low molecular weight dimeric species such as p-cresol dimer, from phenolic polymers, particularly from novolak condensates, and to photoresist compositions containing such dimer-free novalak polymers.

2. Description of Related Art

Novolak condensates or resins are formed by reacting phenolic compounds with aldehydes such as formaldehyde in the presence of an acid catalyst. Novolaks formed from mixtures of p-cresol and p-cresol are particularly useful as binders in photoresist compositions because of their excellent resistance to plasma-etching and their high alkali solubility.

It is known to those skilled in the art of photoresist compositions that the use of larger proportions of p-cresol, as the phenolic reactant in novolaks formed from mixtures of o-cresol, p-cresol and p-cresol, can improve the lithographic performance of the photoresist images, particularly with respect to resolution and image profile. However, it has been found that the incorporation of larger amounts of p-cresol results in an increase in the amount of insoluble residue, or scum, remaining in the image areas, which residue or scum cannot be removed by the development process. Analytical studies have shown that this residue or scum is largely caused by the presence of phenolic dimers, particularly the dimer of p-cresol, in novolaks formed from phenolic compounds comprising p-cresol, as shown by gel-permeation chromotography.

SUMMARY OF THE INVENTION

The present invention relates to a novel process for the complete and selective removal of phenolic dimers, particularly p-cresol dimers, from polymers formed from phenolic compounds which include unwanted dimers, most particularly from phenol-aldehyde condensates or resins, in order to provide dimer-free polymers such as novolaks and high resolution photoresists containing such dimer-free novolaks, which exhibit scum-free images.

The present process has important advantages over other processes which can be used to remove dimers from novolaks. One such process involves the direct distillation of the dimers using a high temperature/high vacuum distillation process. However, at the required temperatures, the novolak is altered chemically by cross-linking, with resultant increase in molecular weight and alteration of solubility properties. Even under the rigorous distillation conditions, which make the process impractical for use in a manufacturing facility, the dimers resist complete distillation.

Another unsatisfactory dimer-removal process involves solvent fractionation. Such process is not selective to dimers, and other oligomeric species are also removed. Also fractionation only removes a portion of the dimers, and multiple fractionation steps are required for the removal of a significant portion of the total dimer content from the novolak. These disadvantages make fractionation impractical for commercial use for the present purposes.

The novel process of the present invention is free of the deficiencies and disadvantages of the aforementioned processes since it provides a simple process for the selective and complete removal of dimers from phenolic condensates or resins such as novolaks.

The present process involves the steps of (a) capping the hydroxyl groups of a phenolic resin, including dimers present therewith, with a capping agent; (b) removing the capped dimers by distillation, and (c) subsequently removing the capping group from the resin to leave the dimer free phenolic resin. The purpose of the capping reaction is to produce capped dimers, which have lower boiling points than the dimers, per se. This increases their volability and reduces the temperature necessary for the complete and selective removal thereof from the phenolic resin. Moreover, the phenolic resin itself becomes capped, with resultant stabilization thereof at the distillation temperatures. This prevents the phenolic resin from crosslinking or otherwise being altered chemically or increasing in molecular weight under the distillation conditions.

The present invention is based upon the interrelated discoveries that the reaction of the phenolic hydroxyl groups of a novolak polymer and the hydroxyl groups of phenolic dimers, which are always present therein, with a reactive compound, such as a silyating agent, to temporarily replace or cap the hydroxyl groups with another group, such as a silyl group, results in (1) the formation of capped phenolic dimers which have lower distillation temperatures than the original phenolic dimers, and (2) a reduction in the reactivity of the novolak polymers, per se, at the distillation temperatures employed to distill and remove the capped phenolic dimers from the capped novolak resin.

While silylation is a preferred embodiment of the invention, it appears that the use of any compound which is reactive with the phenolic hydroxy groups will also serve the same purpose of reducing the boiling point or distillation temperature of the phenolic dimers and reducing the reactivity of the novolak polymers at said distillation temperature.

Silyation of phenolic dimers and polymers involves the reaction of a silyating agent with the phenolic hydroxyl groups, resulting in a capping thereof with the silyl radical, to produce chemically-modified dimers and phenolic polymers. The chemically-modified dimers have lower boiling points and thus greater volatility than the dimers per se. The chemically-modified phenolic polymers are more resistant to high temperature chemical alteration and oxidation under the conditions used in the purification process.

While the present purification process is particularly useful for producing dimer-free novolak phenolic resins and their use in high resolution photoresist compositions which produce scum-free images, the present process is also useful for the removal of unwanted dimers from other phenolic resins, particularly those produced from mixtures of methylated phenolic compounds including cresols and/or xylenols. Such polymers include a wide variety of phenol-aldehyde condensates.

A wide variety of conventional silyating agents are known to the art, and can be used in the present process. Representative silyating agents include 1,1,1,3,3,3-hexamethyldisilazane (HMDS), trimethylsilyl chloride and t-butylmethylsilyl chloride. Such reactants are generally used in an amount which provides a slight excess of silylating functionality relative to the number of phenolic hydroxy groups present in the phenolic polymer composition, including the dimers present as undesirable impurities in such composition.

The silylation reaction preferably is carried out in the presence of a volatile vehicle which is inert with respect to the silylating agent and the phenolic polymer and, which is a solvent for both. Preferred solvents are ethyl cellosolve acetate (ECA) and tetrahydrofuran. Alcoholic solvents cannot be used since they are reactive with silylating agents.

The following example is give as illustrative of the preparation of a dimer-free novolak and should not be considered limitative of the present process.

EXAMPLE 1 a. Silylation of the Novolak: A novolak resin composition (400.0 g), prepared from a 40/60 meta-/paracresol molar feedstock ratio and supplied by Borden Chemicals, was dissolved in ethyl cellosolve acetate (400.0 g) with mild heating. The solution was allowed to cool to room temperature. 1,1,1,3,3,3-Hexamethyldisilazane (HMDS) (280.8 g, 1.74 moles) was added dropwise to the novolak solution over a period of 15 minutes. This quantity provides a slight excess of silylating functionality (approximately 105%) relative to the number of phenolic hydroxyls in the novolak composition. Copious bubbling ensued (evolution of ammonia gas) and the solution temperature rose to 40° C. After 30 minutes the gas evolution ceased. At this point the hydroxyls of the novolak, and the dimers present therein, were essentially completely capped with trimethylsilyl functionality as evidenced by the lack of the —OH stretch absorption (3000 to 3500 cm$^{-1}$ in the infrared spectra.

b. Removal of Silylated Dimer: The solution obtained above was atmospherically distilled to remove solvents over a period of 90 minutes up to a temperature of 200° C. The remaining solvent was removed by vacuum distillation (1.0 to 1.5 torr) at 200° C. Then, under the same vacuum conditions, the temperature was increased to 260° C.. Over a period of 80 minutes the silylated dimer distilled as a clear, colorless and moderately viscous liquid. (If higher vacuum was employed, silylated species with even higher molecular weights were distilled)

c. Desilylation of the Novolak: The dimer-free silylated novolak, prepared above, was dissolved in ethyl cellosolve acetate (400.0 g) with mild heating. The forming solution was then heated to 120° C. and water (64.0 g, 3.56 moles) was added, formatting two liquid phases. Oxalic acid dihydrate catalyst (4.0g) was added and the solution was refluxed at 100° C for 20.5 hours. Over a period of 40 minutes, the solvents were atmospherically distilled up to a temperature of 180° C. The remaining solvent and residual catalyst were removed via a vacuum distillation at 1-1.5 torr and 200° C. for 115 minutes. A dark brown, glassy novolak (354.0 g) was obtained. Thus, essentially all of the dimer (9 wt% relative to the starting novolak) was removed from the novolak as evidenced by the yield data and gel permeation chromotography.

The use of novolak resins, purified of phenolic dimers such as p-cresol dimers, as binder materials for conventional novolak-base photoresist compositions results in the formation of photosensitive resist layers which, after exposure and development, provide high resolution, fine line images which are substantially free of scum or insoluble residue in the image areas. Similar photoresist compositions which are identical, except that the novolak is not pretreated and purified in accordance with the present invention, exhibit the presence of a scum or developer-insoluble residue in the image areas which substantially degrades the resolution or fineness of the image areas and renders the images unsatisfactory for use in applications in which high resolution is essential.

Reference is made to U.S. Pat. Nos. 3,046,120; 4,238,559; 4,464,458 and 4,529,682 for their disclosure of various conventional novolak-base photoresist compositions, coating processes exposure techniques and development materials and procedures. The present dimer-free novolak resins can be used in such compositions and processed in the manners disclosed to produce high resolution, scum-free developed images.

U.S. Pat. No. 4,529,682 discloses the purification of novolak resins, prior to their incorporation into photoresist compositions, by distilling off unreacted cresol monomers at a temperature of 230° C. under near-total vacuum. Phenolic dimers are not removed since they do not distill under these conditions, and the patentee does not use higher temperatures because novolak resins are reactive at higher temperatures and lose the properties which make them useful in photoresist compositions.

The following example is illustrative of an improved photoresist composition based upon the present dimer-free novolak resins as binder materials and should not be considered limitative.

EXAMPLE 2

A photoresist composition is produced by dissolving from about 50% to 95% by weight of a dimer-free novolak resin produced according to Example 1 in a suitable solvent, such as a mixture of ethyl Cellosolve acetate, butyl acetate and xylene, and then dissolving from about 5% to 50% by weight of a suitable diazoquinone photosensitizer such as any one of the naphthoquinone diazide sulfonyl chloride esters disclosed in U.S. Pat. No. 4,529,682.

The solution is allowed to stand for about 12 hours and is then microfiltered to produce a uniform solution, after which any of the conventional optional photoresist ingredients can be added in conventional amounts. Such additives include dyes, plasticizers, adhesion promoters anti-striation agents, surfactants and speed enhancers.

The photoresist composition solution is coated in conventional manner, such as by spin-coating, onto a suitable substrate such as thermally-grown silicon silicon dioxide-coated wafers. The photoresist-coated wafers are baked at about 100° C. to evaporate the solvents and leave a thin photosensitive coating having a thickness of about 1 micron. The coated, dried wafers are then ready for exposure, such as to actinic radiation passed through a suitable mask, negative, stencil, template or other means for shielding selected portions of the photosensitive coating against exposure to the radiation.

The radiation-exposed coated areas of the wafers are rendered soluble in conventional alkaline developer solutions and are dissolved away on immersion therein to leave a negative pattern of the insoluble photoresist composition. Finally the wafers are baked in order to increase the adhesion of the insoluble photoresist coating to the wafer and to increase its resistance to etching solutions.

The image areas exhibit high resolution and good edge profile due to the absence developer-insoluble scum, such as dimers, in such areas.

Although variations are shown in the present application, many modifications and ramifications will occur to those skilled in the art upon a reading of the present disclosure. These, too, are intended to be included herein.

What is claimed is:

1. Process for the selective removal of phenolic dimers from phenolic polymer compositions containing said dimers, comprising the steps of:
   (a) providing a phenolic polymer composition containing at least a minor amount by weight of one or more phenolic dimers;
   (b) adding a capping agent to said composition in an amount which provides at least one capping group for reaction with each phenolic hydroxy group present in said composition under conditions which cause said capping agent to react with and cap each said phenolic hydroxy group of said phenolic polymer, rendering said phenolic polymer more heat-stable, and which convert said phenolic dimers to capped phenolic dimers which have a lower distillation temperature than the said dimers in uncapped form;
   (c) subjecting the capped phenolic polymer composition to distillation conditions to effect selective evaporation and removal of the capped phenolic dimers;
   (d) removing the capping group from remaining capped phenolic polymer thereby restoring the hydroxy groups originally present in said phenolic polymer, and
   (e) isolating said phenolic polymer which has been purified of said phenolic dimers.

2. Process according to claim 1 in which said phenolic polymer comprises a phenol-aldehyde condensate made from a mixture of cresols including p-cresol, and said phenolic dimers include the dimer of p-cresol.

3. Process according to claim 2 in which said phenol-aldehyde condensate comprises a novolak polymer.

4. Process according to claim 1 in which the distillation of step (c) is completed under vacuum conditions and at a temperature which does not alter the silylated phenolic polymer.

5. Process according to claim 1 in which said capping agent is a silylating agent which caps said phenolic polymer and said phenolic dimers with silyl groups.

6. Process according to claim 5 in which the silylation step (b) is carried out in the presence of a volatile inert solvent for said phenolic polymer and said capping agent.

7. Process according to claim 6 in which said silylating agent is selected from the groups consisting of 1,1,1,3,3,3-hexamethyldislazane, trimethylsilyl chloride, and t-butylmethylsilyl chloride.

8. Process of claim 3 wherein said novolak polymer is formed from a mixture of cresols.

9. Process of claim 8 wherein said mixture of cresols contains a major amount by weight of p-cresol.

* * * * *